(12) United States Patent
Husain et al.

(10) Patent No.: US 7,659,588 B2
(45) Date of Patent: Feb. 9, 2010

(54) TERMINATION FOR A SUPERJUNCTION DEVICE

(75) Inventors: Ali Husain, Los Angeles, CA (US); Srikant Sridevan, Redondo Beach, CA (US)

(73) Assignee: Siliconix Technology C. V., Singapore (SG)

( * ) Notice: Subject to any disclaimer, the term of this patent is extended or adjusted under 35 U.S.C. 154(b) by 60 days.

(21) Appl. No.: 11/698,373

(22) Filed: Jan. 26, 2007

(65) Prior Publication Data
US 2007/0222025 A1   Sep. 27, 2007

Related U.S. Application Data

(60) Provisional application No. 60/762,793, filed on Jan. 26, 2006.

(51) Int. Cl.
*H01L 29/72* (2006.01)

(52) U.S. Cl. .............. 257/401; 257/341; 257/329; 257/328; 257/487

(58) Field of Classification Search ........... 438/200; 257/330, 329, 331, 499, 487, 401, 341
See application file for complete search history.

(56) References Cited

U.S. PATENT DOCUMENTS

| | | |
|---|---|---|
| 6,441,455 B1 | 8/2002 | Dutta |
| 6,498,368 B2 | 12/2002 | Sakamoto et al. |
| 6,621,122 B2 | 9/2003 | Qu |
| 6,768,170 B2 | 7/2004 | Zhou |
| 7,166,890 B2 | 1/2007 | Sridevan |
| 7,492,003 B2 | 2/2009 | Kinzer |
| 2003/0176031 A1* | 9/2003 | Onishi et al. ............ 438/200 |

* cited by examiner

*Primary Examiner*—Fernando L Toledo
*Assistant Examiner*—Mamadou Diallo

(57) ABSTRACT

A superjunction device that includes a termination region having a transition region adjacent the active region thereof, the transition region including a plurality of spaced columns.

13 Claims, 6 Drawing Sheets

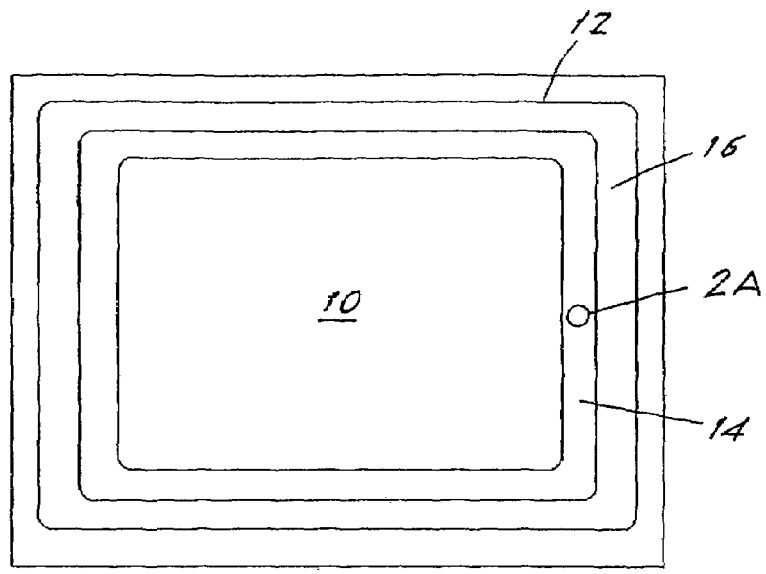
FIG. 1
PRIOR ART
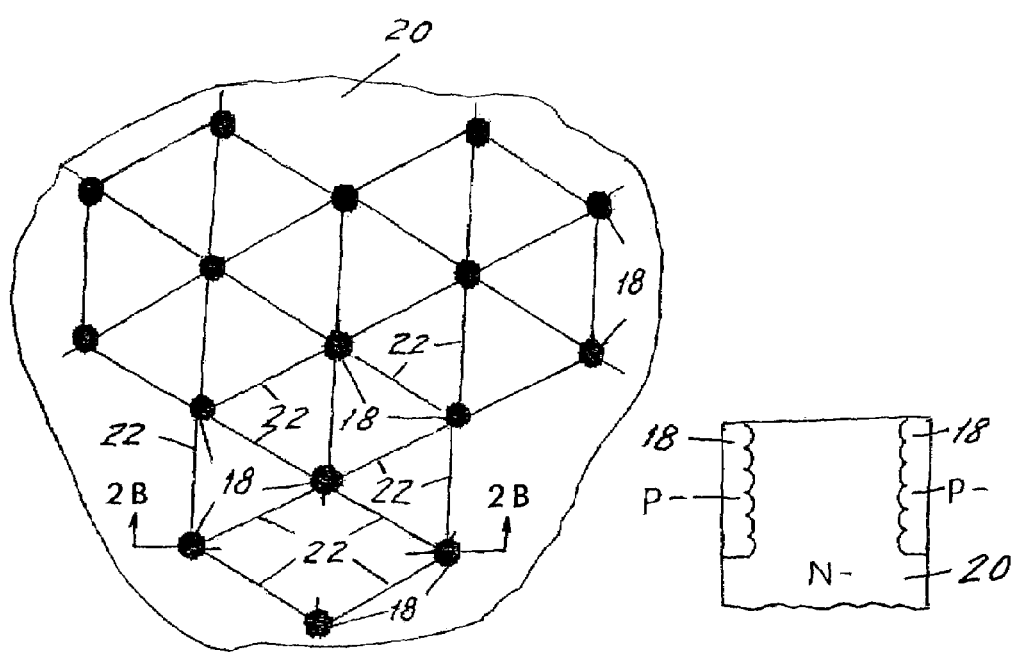
FIG. 2 A
FIG. 2 B

TERMINATION FOR A SUPERJUNCTION DEVICE

RELATED APPLICATION

This application is based on and claims priority to the U.S. Provisional Application Ser. No. 60/762,793, filed on Jan. 26, 2006, entitled Termination for Superjunction Device, to which a claim of priority is hereby made and the disclosure of which is incorporated by reference.

BACKGROUND OF THE INVENTION

The present invention relates to power semiconductor devices and more particularly to a termination arrangement for a superjunction power semiconductor device.

A superjunction arrangement having a cellular design in the active region thereof can be terminated with dense p-columns as a transition to a race-track structure. The weak point of the device with respect to avalanche breakdown is at the interface between the active cells and the dense p-columns in the transition region. Conventional designs utilize a transition region having a hexagonal lattice similar to the hexagonal lattice of the active cells, but with half the lattice constant and, crucially, offset. The offset breaks the symmetry in some lattice directions resulting in weak points where the device is more susceptible to avalanche breakdown.

SUMMARY OF THE INVENTION

According to the present invention, the interface can be rendered denser to improve the breakdown voltage by starting from a basic hexagonal lattice pattern derived from the hexagonal lattice pattern of the active cells of the active area.

The breakdown voltage of the termination of a superjunction power semiconductor device having a semiconductor body of one conductivity, an active region formed in the semiconductor body, and a termination region having a transition region adjacent the active region can be improved by forming a termination region having a transition region adjacent the active region, the transition region including a plurality of columns of another conductivity in the semiconductor body, a cross-section taken normal to the longitudinal axes of the columns having a pattern in which one group of the columns are disposed at corners of a hexagon, one of the columns is disposed at the centroid of the hexagon, the columns at the corners and the column at the centroid forming a plurality of equilateral triangles, each triangle including the column at the centroid at one corner thereof, and two columns at the other corners thereof, and another group of the columns each being positioned equidistant from another two oppositely disposed columns at corners of an equilateral triangle.

In one embodiment, each column from the another group is positioned on a side of a respective equilateral triangle.

In another embodiment, each column from the another group is positioned at the centroid of a respective equilateral triangle.

A pattern may also be generated by combining the first embodiment and the second embodiment, whereby the another group of columns includes a first set of columns and a second set of columns, each column in the first set of columns positioned on a side of a respective equilateral triangle, and each column in the second set of columns disposed at the centroid of a respective equilateral triangle.

Alternatively, a pattern may be generated by repeating the first embodiment twice whereby the another group of columns includes a first set of columns and a second set of columns, each column in the first set of columns positioned on a side of a respective equilateral triangle forming a second equilateral triangle, and each column in the second set of columns disposed at a side of a respective second equilateral triangle.

Or, a pattern may be generated by repeating the second embodiment twice whereby the another group of columns includes a first set of columns and a second set of columns, each column in the first set of columns positioned at the centroid of a respective equilateral triangle each two forming a second equilateral triangle with a column of the hexagon, and each column in the second set of columns disposed at the centroid of a respective second equilateral triangle.

Thus, a power semiconductor device according to the present invention includes a semiconductor body of one conductivity, an active region formed in the semiconductor body, and a termination region having a transition region adjacent the active region that includes a plurality of columns of another conductivity formed in the semiconductor body, a cross-section of the columns taken normal to the longitudinal axes of the columns having a pattern in which one group of the columns are disposed at corners of a hexagon, one of the columns is disposed at the centroid of the hexagon, the columns at the corners and the column at the centroid forming a plurality of equilateral triangles, each triangle including the column at the centroid at one corner thereof, and two columns at the other corners thereof, and another group of the columns each being positioned equidistant from another two oppositely disposed columns at corners of an equilateral triangle.

In a first embodiment of the present invention, each column in the another group of columns is disposed on a side of a respective equilateral triangle.

In a second embodiment of the present invention, each column in the another group of columns is disposed at the centroid of a respective equilateral triangle.

The features of the first and the second embodiment can be combined such that the another group of columns includes a first set of columns and a second set of columns, each column in the first set of columns is disposed on a side of a respective equilateral triangle, and each column in the second set of columns is disposed at the centroid of a respective equilateral triangle.

Other features and advantages of the present invention will become apparent from the following description of the invention which refers to the accompanying drawings.

SUMMARY OF THE FIGURES

FIG. 1 illustrates schematically a top plan view of a device according to the prior art.

FIG. 2A illustrates an enlarged top plan view of section 2A in FIG. 1.

FIG. 2B illustrates a cross-sectional view along line 2B-2B in FIG. 2A viewed in the direction of the arrows.

DETAILED DESCRIPTION OF THE FIGURES

Figure 3A:
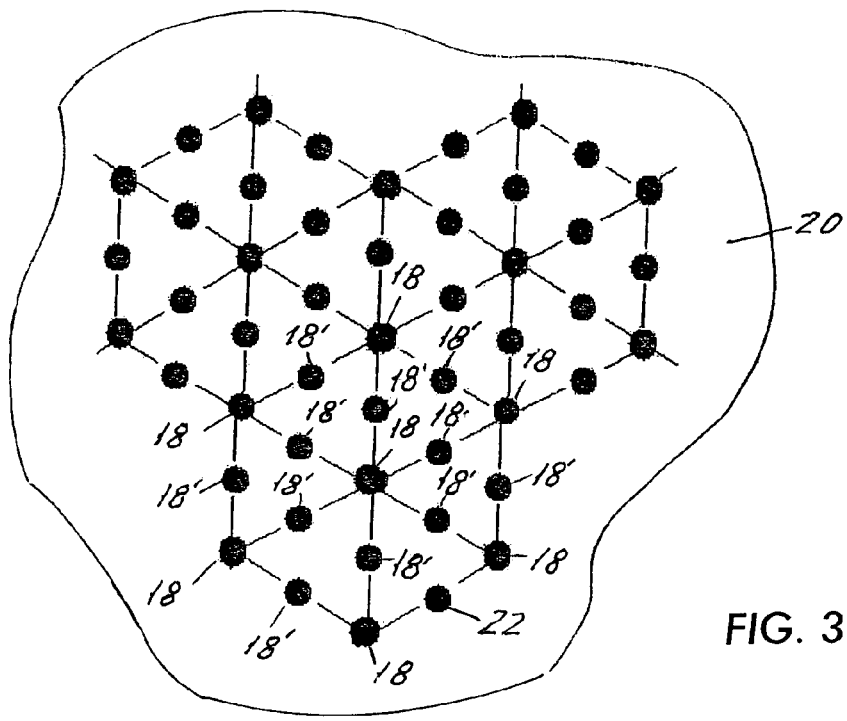
FIG. 3A illustrates a portion of the transition region in the termination region of a device according to the first embodiment of the present invention.

Referring to FIG. 1, a typical power semiconductor MOSFET having a superjunction arrangement includes active region 10, and a termination region 12 adjacent active region 10. Both active region 10 and termination region 12 are formed in a semiconductor body of one conductivity (e.g. N-type). Termination region 12 includes a transition region 14 adjacent active region 10 and region 16 that is comprised of a plurality of annular, continuous, and spaced rings of another conductivity, e.g. p-type, (sometimes referred to as a "race track" termination). Region 16 is disposed adjacent transition region 14 and the edges of the power device.

Referring now to FIG. 2A, transition region 14 includes a plurality of columns 18 of another conductivity (e.g. P-type), opposite to the one conductivity of semiconductor body 20, in which columns 18 are formed. Note that columns 18 are usually about the same width and extend to about the same depth. Note that FIG. 2A illustrates a cross-section normal to the vertical axes of columns 18 as formed in semiconductor body 20. As illustrated, columns 18 are arranged such that a column is disposed at a respective corner of a hexagon, while one column 18 is disposed at the centroid of the hexagon. One such hexagonal pattern is identified for illustrative purposes by connecting lines 22, which should not be understood to represent any physical structural feature in the device. Note that, each hexagon can be divided into six equilateral triangles each having a column at a corner thereof, at least one of which is a column 18 at the centroid of the hexagon.

In a device according to the present invention transition region 14 is modified to have columns arranged in a pattern according to one of the embodiments described below. A device according to the preferred embodiment will include an active region 10, and region 16 as described above.

FIG. 3A illustrates the result of a transformation (hereafter A transformation) to generate a pattern of columns 18, 18' according to the first embodiment of the present invention. According to the first embodiment, the location for each column 18' is selected to be equidistant from at least two columns 18 at the end of each side of an equilateral triangle having column 18 at the centroid of a hexagon at one corner thereof. Thus, in a device according to the first embodiment of the present invention, a column 18' of another conductivity is disposed on a side of each equilateral triangle equidistant from columns 18 at the respective ends of the side. As a result, each triangle would include three columns 18 at a respective corner thereof, and three columns 18' each on a respective side thereof. Note that columns 18' may be the same width, the same depth of, and the same resistivity as columns 18.

Figure 3B:
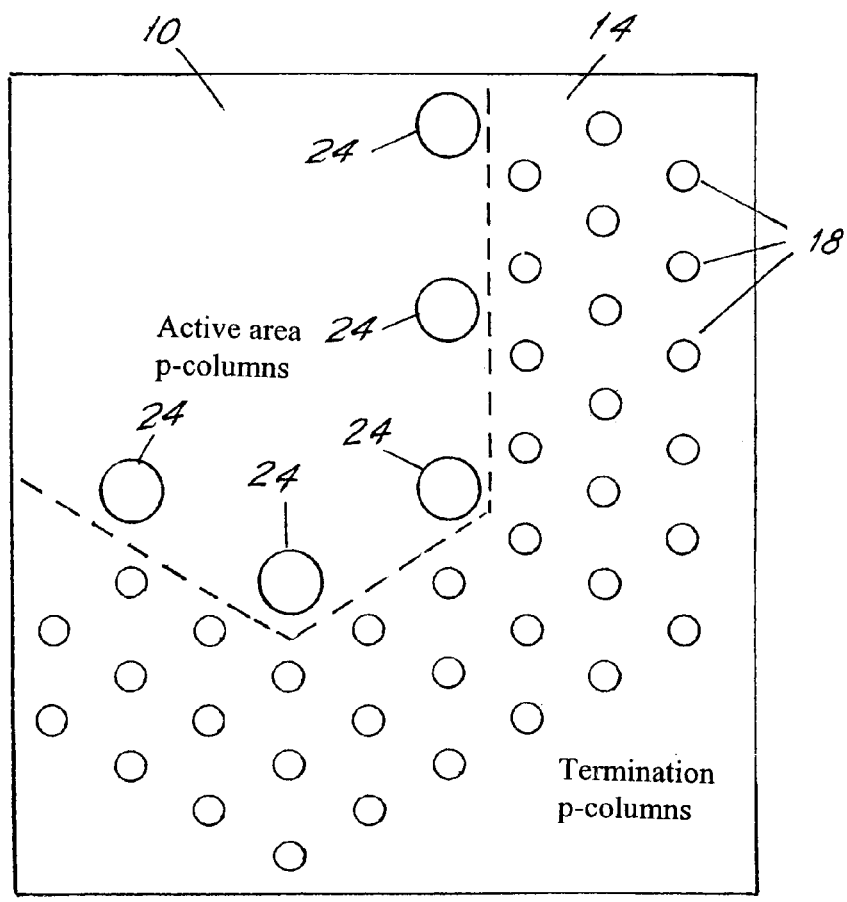
FIG. 3B illustrates a portion of the transition region according to the first embodiment adjacent the active region of the device.

FIG. 3B illustrates a portion of transition region 14 patterned according to transition A alongside of active region 10 of a device according to the present invention. Note that because a device according to the present invention is a superjunction device active region 10 thereof may also include columns 24 of the another conductivity formed in semiconductor body of the one conductivity. Columns 24 are in substantial charge balance as is well known to result in a superjunction arrangement. Also, note that columns 24 may be wider, and in some cases deeper than columns 18, 18' in transition region 14.

Figure 4A:
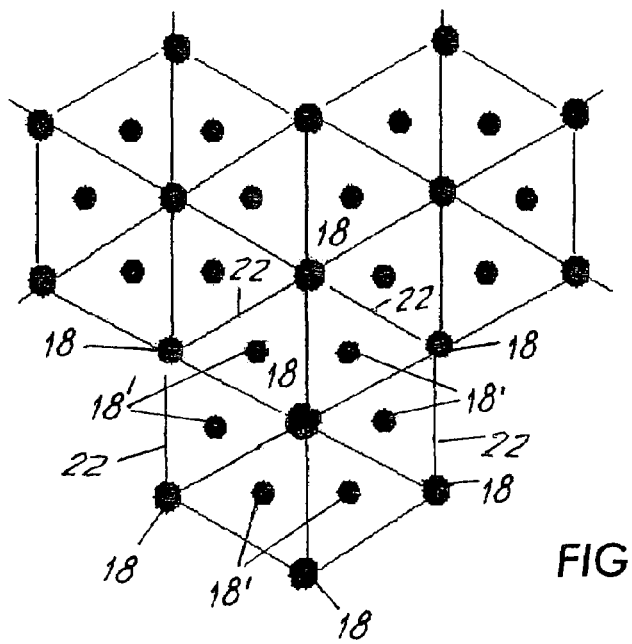
FIG. 4A illustrates a portion of the transition region in the termination region of a device according to the second embodiment of the present invention.

Referring now to FIG. 4A, in a transformation (hereafter transformation B) according to the second embodiment of the present invention columns 18' of the another conductivity are disposed at the centroid of each equilateral triangle that forms the basic hexagon pattern described above.

Figure 4B:
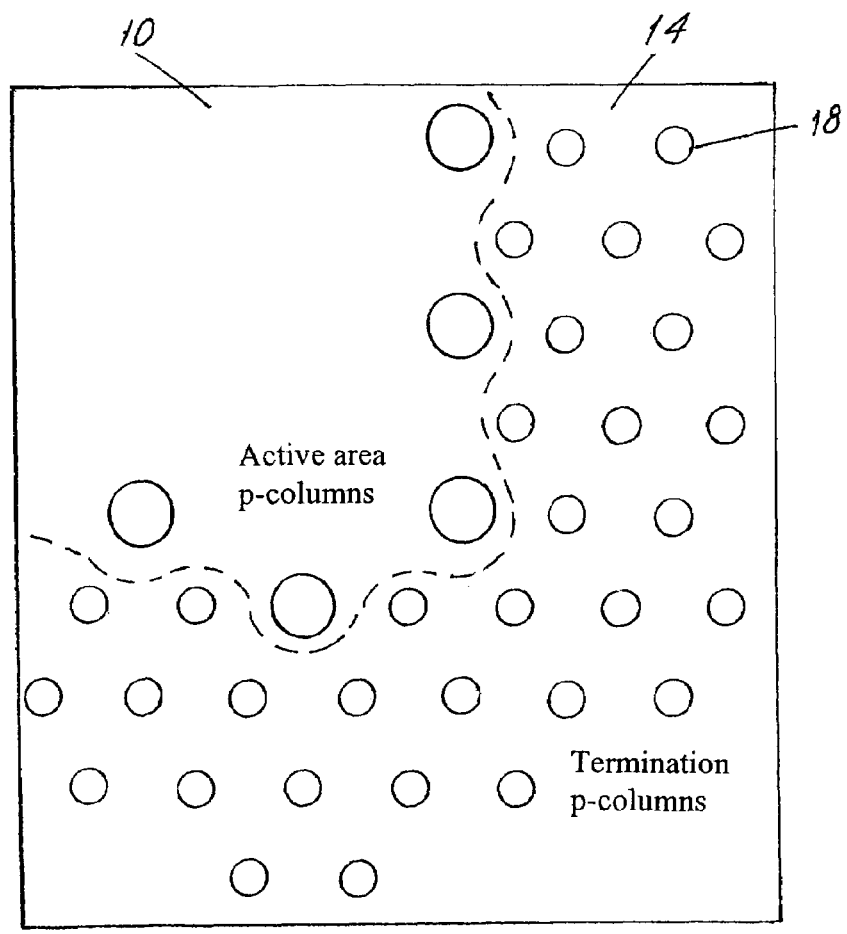
FIG. 4B illustrates a portion of the transition region according to the second embodiment adjacent the active region of the device.

Each column 18' due to its position is equidistant from all three columns 18 at the corners of the triangle. Thus, in each embodiment columns 18' is equidistant at least from two columns 18 at the corners of an equilateral triangle. FIG. 4B illustrates the pattern of columns 18, 18' in transition region 14 obtained according to the second embodiment adjacent active region 10 of a device according to the present invention.

Figure 5A:
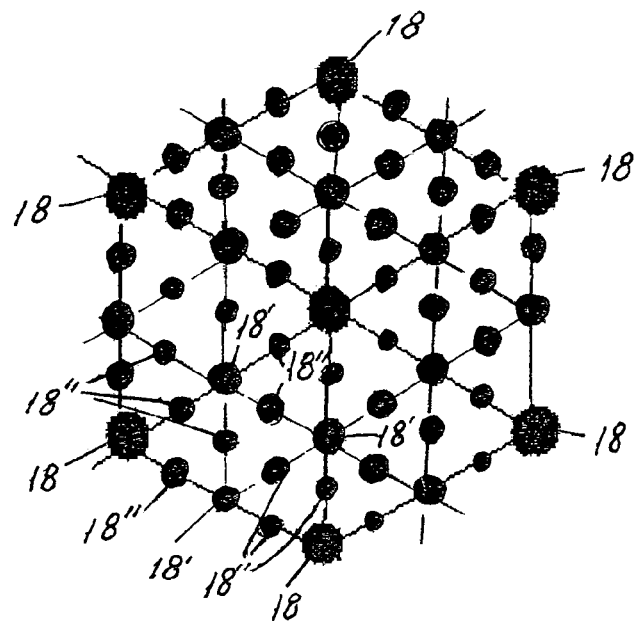
FIG. 5A illustrates a portion of the transition region in the termination region of a device according to the third embodiment of the present invention.
Figure 5B:
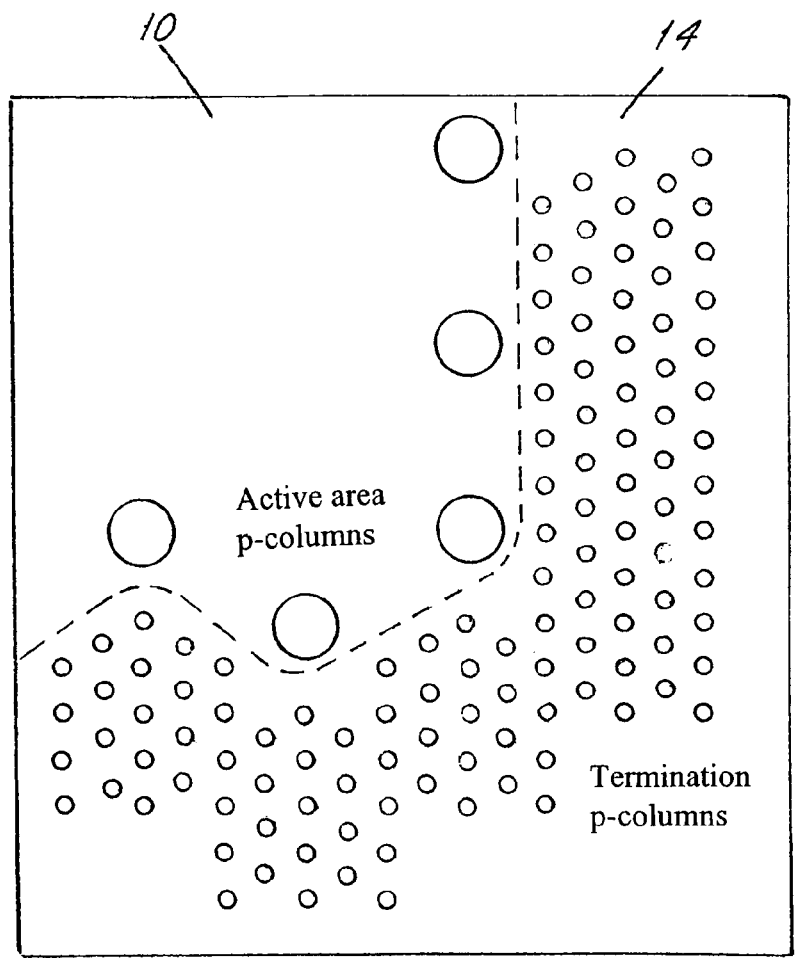
FIG. 5B illustrates a portion of the transition region according to the third embodiment adjacent the active region of the device.

Referring now to FIG. 5A, according to the third embodiment of the present invention transformation A can be repeated on a pattern according to the first embodiment by disposing columns 18" on a side of an equilateral triangle resulting from the disposition of columns 18', and/or an equilateral triangle resulting from two columns 18' and a column 18. Note that each column 18" is located equidistant from the columns at the end of the side on which it is disposed. Thus, a transformation (hereafter transformation AA) can be obtained in which transformation A is repeated to obtain a pattern according to the third embodiment of the present invention. FIG. 5B illustrates a pattern according to third embodiment adjacent active region 10 in a device according to the present invention.

Figure 6A:
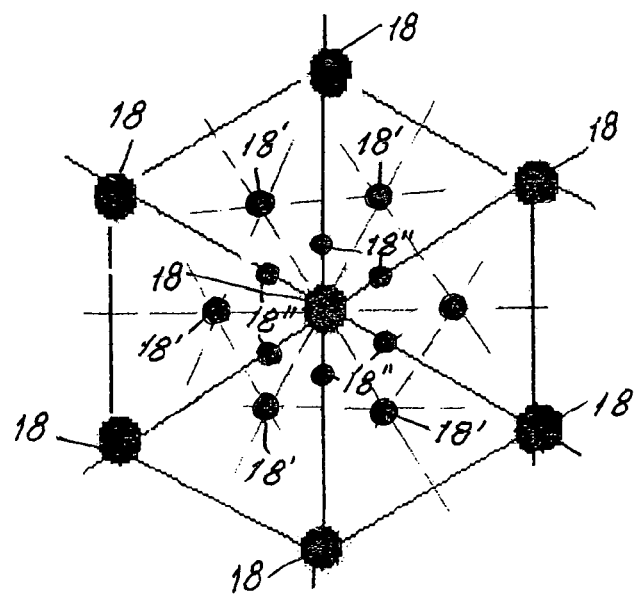
FIG. 6A illustrates a portion of the transition region in the termination region of a device according to the fourth embodiment of the present invention.

Referring now to FIG. 6A, according to the fourth embodiment of the present invention transformation B can be repeated on a pattern according to the second embodiment by disposing a column 18" at the centroid of an equilateral triangle resulting from the disposition of columns 18' and 18. Thus a transformation (hereafter transformation BB) can be obtained which results in a pattern according to the fourth embodiment of the present invention.

Figure 6B:
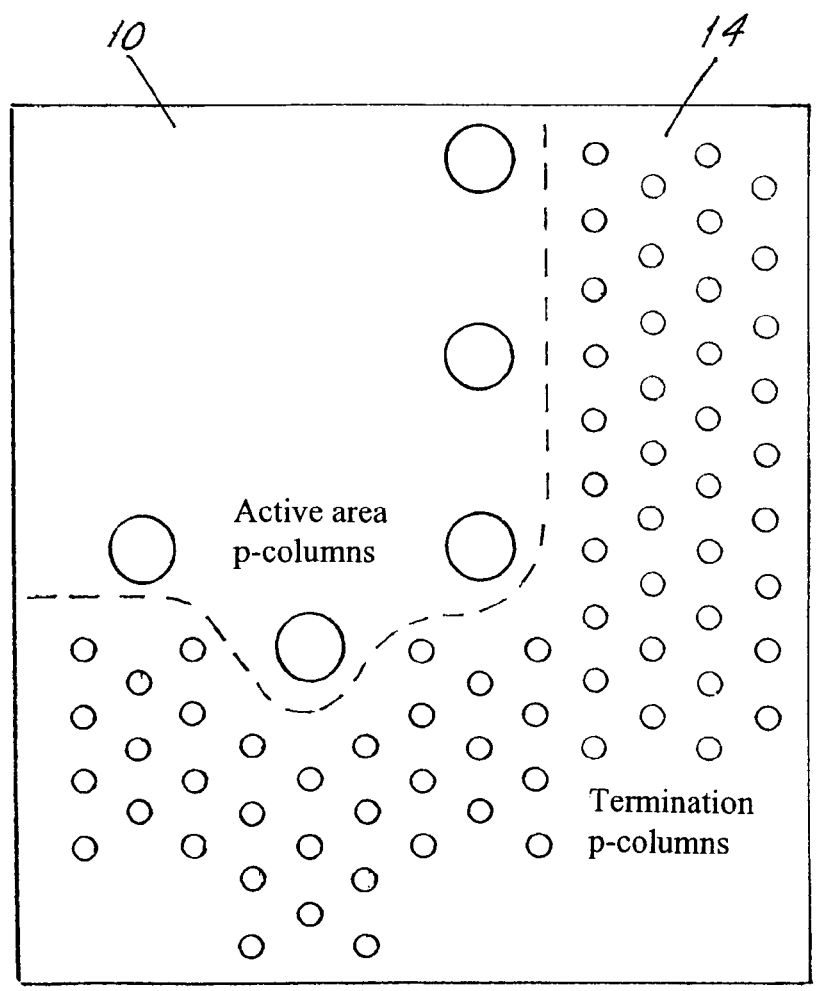
FIG. 6B illustrates a portion of the transition region according to the fourth embodiment adjacent the active region of the device.

FIG. 6b illustrates a pattern of columns obtained according to transformation BB adjacent active region 10 of a device according to the present invention.

Figure 7A:
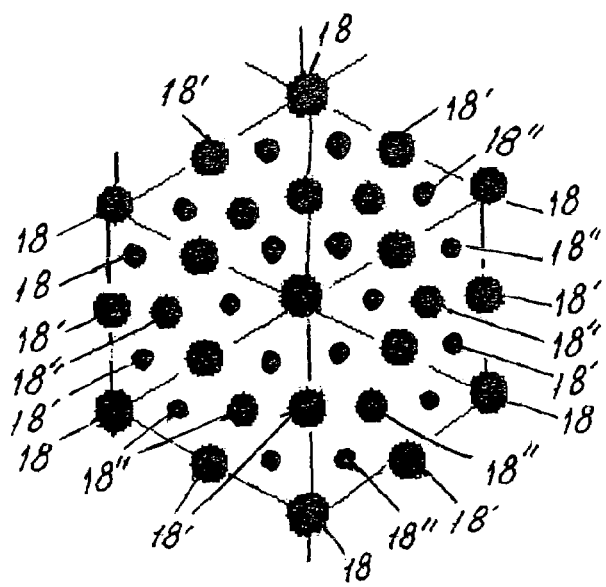
FIG. 7A illustrates a portion of the transition region in the termination region of a device according to the fifth embodiment of the present invention.

Referring now to FIG. 7A, according to the fifth embodiment of the present invention transformation B can be applied to a pattern according to the first embodiment (transformation A) by disposing a column 18" at the centroid of each equilateral triangle resulting from the disposition of columns 18' according to transformation A. Thus, a new transformation (hereafter BA) can be obtained which can generate a pattern of columns according to the fifth embodiment of the present invention. Note that, because of symmetry, transformation A can be applied to a pattern obtained by transformation B (second embodiment) to obtain a pattern according to the fifth embodiment of the present invention.

Figure 7B:
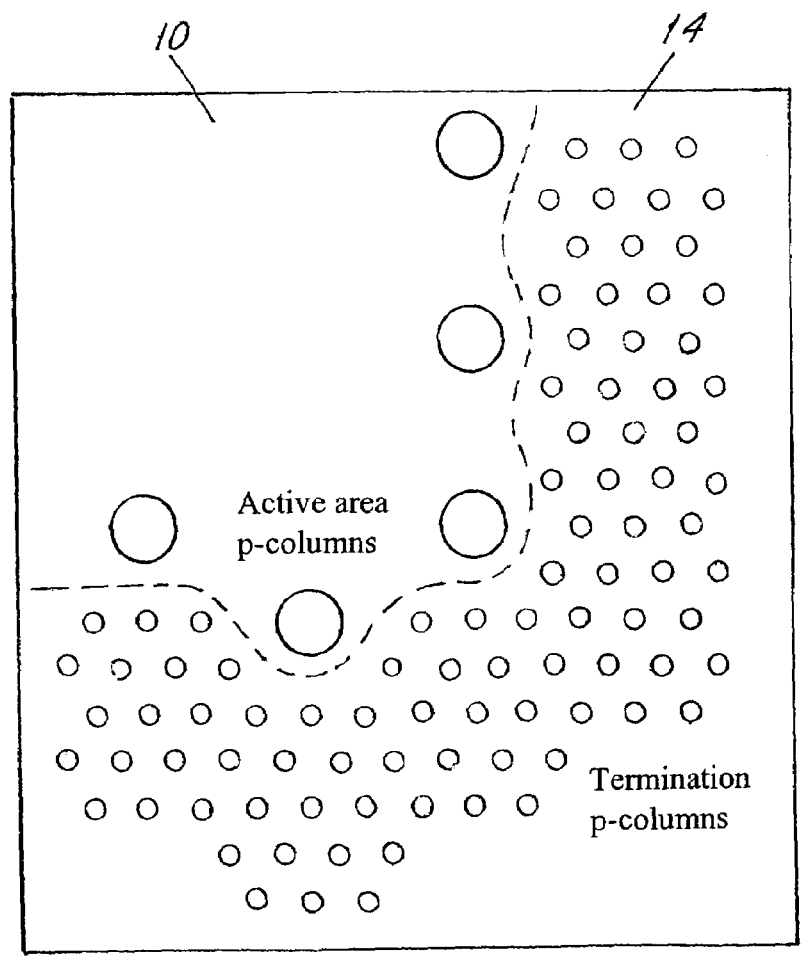
FIG. 7B illustrates a portion of the transition region according to the fifth embodiment adjacent the active region of the device.

FIG. 7B illustrates a pattern according to the fifth embodiment adjacent active region 10 in a device according to the present invention.

Note that in each embodiment the columns in the transition region are preferably of the same width, the same depth, and the same resistivity.

According to the present invention, the density of the columns in the transition region can be increased while the size (e.g. the width) thereof can be decreased resulting in an increase in the breakdown voltage. The decrease in the size of the columns in the transition region can conserve the total area (and hence charge) of the columns. For example, in the A transformation, there are four times as many columns 18,18' in the same area, so the diameter of columns can be half that of the columns in the active area. As an added advantage, the interface can be modeled to maximize the breakdown voltage by adding or removing columns 18, 18' of the denser lattice.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
   a semiconductor body of one conductivity;
   an active region formed in said semiconductor body; and
   a termination region having a transition region adjacent said active region that includes a plurality of columns of a conductivity different than said one conductivity formed in said semiconductor body, a cross-section of said plurality of columns taken normal to the longitudinal axes of said plurality of columns having a pattern in which a first group of said plurality of columns are disposed at corners of a hexagon and at the centroid of said hexagon, said first group forming a plurality of equilateral triangles with said column at said centroid at one corner thereof and two columns at the other corners thereof, and a second group of said plurality of columns wherein each of said columns of said second group being positioned equidistant from two of said plurality of columns in said first group, wherein columns of said plurality of columns have substantially analogous resistivity.

2. The power semiconductor device of claim 1, wherein each column in said second group of columns is disposed on a side of a respective equilateral triangle and is equidistant from two vertices of said respective equilateral triangle.

3. The power semiconductor device of claim 1, wherein each column in said second group of columns is disposed at the centroid of a respective equilateral triangle and is equidistant from each vertices of said respective equilateral triangle.

4. The power semiconductor device of claim 1, wherein said second group of columns includes a first set of columns and a second set of columns, each column in said first set of columns is disposed on a side of a respective equilateral triangle, and each column in said second set of columns is disposed at the centroid of a respective equilateral triangle.

5. The power semiconductor device of claim 1, further comprising a race track termination disposed around said transition region between said transition region and the edges of said semiconductor device.

6. A method for improving the breakdown at the termination of a superjunction power semiconductor device having a semiconductor body of one conductivity, an active region formed in said semiconductor body, and a termination region having a transition region adjacent said active region, comprising:
   forming a termination region having a transition region adjacent said active region, said transition region including a plurality of columns of a conductivity different than said one conductivity in said semiconductor body, a cross-section taken normal to the longitudinal axes of said plurality of columns having a pattern in which a first group of said plurality of columns are disposed at corners of a hexagon and at the centroid of said hexagon, said first group forming a plurality of equilateral triangles, each triangle including said column at said centroid at one corner thereof and two columns at the other corners thereof, and a second group of said plurality of columns wherein each of said columns of said second group being positioned equidistant from two of said plurality of columns in said first group, wherein columns of said plurality of columns have substantially analogous resistivity.

7. The method of claim 6, wherein each column from said second group is positioned on a side of a respective equilateral triangle and is equidistant from two vertices of said respective equilateral triangle.

8. The method of claim 6, wherein each column from said second group is positioned at the centroid of a respective equilateral triangle and is equidistant from each vertices of said respective equilateral triangle.

9. The method of claim 6, wherein said second group of columns includes a first set of columns and a second set of columns, each column in said first set of columns is positioned on a side of a respective equilateral triangle, and each column in said second set of columns is disposed at the centroid of a respective equilateral triangle.

10. The method of claim 6, wherein said second group of columns includes a first set of columns and a second set of columns, each column in said first set of columns is positioned on a side of a respective equilateral triangle forming a second equilateral triangle, and each column in said second set of columns is disposed at a side of a respective equilateral triangle from said first group.

11. The method of claim 6, wherein said second group of columns includes a first set of columns and a second set of columns, each column in said first set of columns is positioned at the centroid of a respective equilateral triangle each two forming a second equilateral triangle with a column of said hexagon, and each column in said second set of columns is disposed at the centroid of a respective second equilateral triangle.

12. The method of claim 6 further comprising:
   increasing a breakdown voltage by increasing a density of said plurality of columns and decreasing a width of said plurality of columns.

13. The power semiconductor device of claim 1, wherein a breakdown voltage is increased by increasing a density of said plurality of columns and decreasing a width of said plurality of columns.

* * * * *